United States Patent
Kishimoto

(10) Patent No.: US 11,183,674 B2
(45) Date of Patent: Nov. 23, 2021

(54) METHOD FOR MANUFACTURING FLEXIBLE OLED DEVICE AND SUPPORT SUBSTRATE

(71) Applicant: SAKAI DISPLAY PRODUCTS CORPORATION, Sakai (JP)

(72) Inventor: Katsuhiko Kishimoto, Sakai (JP)

(73) Assignee: SAKAI DISPLAY PRODUCTS CORPORATION, Sakai (JP)

(*) Notice: Subject to any disclaimer, the term of this patent is extended or adjusted under 35 U.S.C. 154(b) by 0 days.

(21) Appl. No.: 16/624,253

(22) PCT Filed: Feb. 27, 2018

(86) PCT No.: PCT/JP2018/007299
§ 371 (c)(1),
(2) Date: Mar. 3, 2020

(87) PCT Pub. No.: WO2019/167131
PCT Pub. Date: Sep. 6, 2019

(65) Prior Publication Data
US 2020/0411803 A1 Dec. 31, 2020

(51) Int. Cl.
*H01L 51/56* (2006.01)
*H01L 21/78* (2006.01)
*H01L 51/00* (2006.01)

(52) U.S. Cl.
CPC .......... *H01L 51/56* (2013.01); *H01L 21/7813* (2013.01); *H01L 51/003* (2013.01); *H01L 51/0097* (2013.01); *H01L 2251/5338* (2013.01)

(58) Field of Classification Search
CPC ............. H01L 51/0097; H01L 51/0056; H01L 21/7806; H01L 21/7813; H01L 2251/5338

USPC ............................................................. 438/99
See application file for complete search history.

(56) References Cited

U.S. PATENT DOCUMENTS

| | | | |
|---|---|---|---|
| 2007/0054436 A1 | 3/2007 | Hirakata et al. | |
| 2011/0204361 A1 | 8/2011 | Nishiki et al. | |
| 2013/0161684 A1* | 6/2013 | Momma | H01L 51/5203 257/100 |
| 2014/0186618 A1* | 7/2014 | Liu | C23C 14/06 428/336 |
| 2015/0069358 A1 | 3/2015 | Chida et al. | |

(Continued)

FOREIGN PATENT DOCUMENTS

| | | |
|---|---|---|
| JP | 2002-031818 A | 1/2002 |
| JP | 2005-157324 A | 6/2005 |

(Continued)

*Primary Examiner* — Thao X Le
*Assistant Examiner* — Gardner W. S. Swan
(74) *Attorney, Agent, or Firm* — ScienBiziP, P.C.

(57) ABSTRACT

According to a method for producing a flexible OLED device of the present disclosure, a multilayer stack (100) is provided, the multilayer stack including a base (10), a functional layer region (20) which includes a TFT layer and an OLED layer, a flexible film (30) provided between the base and the functional layer region and supporting the functional layer region, and a release layer (12) provided between the flexible film and the base and bound to the base. The release layer is irradiated with lift-off light (216) transmitted through the base, whereby the flexible film is delaminated from the release layer. The release layer is made of an alloy of aluminum and silicon.

10 Claims, 10 Drawing Sheets

(56) References Cited

U.S. PATENT DOCUMENTS

| | | | |
|---|---|---|---|
| 2015/0123106 A1* | 5/2015 | Yasumoto | H01L 51/003 257/40 |
| 2015/0155505 A1* | 6/2015 | Yamazaki | H01L 27/3258 257/40 |
| 2015/0165477 A1* | 6/2015 | Yamazaki | B05D 3/107 427/535 |
| 2016/0190523 A1* | 6/2016 | Kim | H01L 51/5253 438/23 |
| 2017/0154947 A1 | 6/2017 | Nakamura | |
| 2018/0149965 A1* | 5/2018 | Iizuka | C22C 21/04 |

FOREIGN PATENT DOCUMENTS

| | | |
|---|---|---|
| JP | 4310784 B2 | 8/2009 |
| JP | 4310788 B2 | 8/2009 |
| JP | 2009-199856 A | 9/2009 |
| JP | 4348217 B2 | 10/2009 |
| JP | 2013-145808 A | 7/2013 |
| JP | 2013-182787 A | 9/2013 |
| JP | 2015-109258 A | 6/2015 |
| JP | 2017-211630 A | 11/2017 |
| WO | 2009/037797 A1 | 3/2009 |

\* cited by examiner

METHOD FOR MANUFACTURING FLEXIBLE OLED DEVICE AND SUPPORT SUBSTRATE

TECHNICAL FIELD

The present disclosure relates to a method for producing a flexible OLED device and a supporting substrate.

BACKGROUND ART

A typical example of the flexible display includes a film which is made of a synthetic resin such as polyimide (hereinafter, referred to as "plastic film"), and elements supported by the plastic film, such as TFTs (Thin Film Transistors) and OLEDs (Organic Light Emitting Diodes). The plastic film functions as a flexible substrate. The flexible display is encapsulated with a gas barrier film (encapsulation film) because an organic semiconductor layer which is a constituent of the OLED is likely to deteriorate due to water vapor.

Production of the flexible display can be carried out using a glass base on which a plastic film is formed over the upper surface. The glass base functions as a support (carrier) for keeping the shape of the plastic film flat during the production process. Elements such as TFTs and OLEDs, a gas barrier film, and the other constituents are formed on the plastic film, whereby the structure of a flexible OLED device is realized while it is supported by the glass base. Thereafter, the flexible OLED device is delaminated from the glass base and gains flexibility. The entirety of a portion in which elements such as TFTs and OLEDs are arrayed can be referred to as "functional layer region".

Patent Document No. 1 discloses the method of irradiating the interface between a flexible substrate and a glass base with ultraviolet laser light (lift-off light) in order to delaminate from the glass base the flexible substrate with OLED devices provided thereon. According to the method disclosed in Patent Document No. 1, an amorphous silicon layer is provided between the flexible substrate and the glass base. The irradiation with the ultraviolet laser light causes generation of hydrogen from the amorphous silicon layer and causes the flexible substrate to be delaminated from the glass base.

CITATION LIST

Patent Literature

Patent Document No. 1: WO 2009/037797

SUMMARY OF INVENTION

Technical Problem

Since plastic films conventionally used in flexible substrates absorb ultraviolet light, the influence of lift-off light irradiation on TFT elements and OLED devices has not been particularly considered. According to research by the present inventor, there is a probability that ultraviolet laser light used in the delamination step will deteriorate TFT elements and OLED devices.

The present disclosure provides a novel method for producing a flexible OLED device and a novel supporting substrate, which are capable of solving the above-described problems.

Solution to Problem

A flexible OLED device production method of the present disclosure includes, in an exemplary embodiment, providing a multilayer stack, the multilayer stack including a base, a functional layer region which includes a TFT layer and an OLED layer, a flexible film provided between the base and the functional layer region and supporting the functional layer region, and a release layer provided between the flexible film and the base and bound to the base; and irradiating the release layer with ultraviolet laser light transmitted through the base, thereby delaminating the flexible film from the release layer. The release layer is made of an alloy of aluminum and silicon.

In one embodiment, a weight percentage of silicon contained in the alloy is not less than 4% and not more than 20%.

In one embodiment, a linear expansion coefficient of the release layer is not less than 30% and not more than 500% of a linear expansion coefficient of the flexible film.

In one embodiment, a thickness of the release layer is not less than 100 nm and not more than 5000 nm.

In one embodiment, a wavelength of the ultraviolet laser light is not less than 300 nm and not more than 360 nm.

In one embodiment, a thickness of the flexible film is not less than 5 μm and not more than 20 μm.

In one embodiment, providing the multilayer stack includes sputtering an aluminum target which contains silicon, thereby forming the release layer on the base, and forming the flexible film on the release layer.

In one embodiment, the method including, after the flexible film is delaminated from the release layer, removing and recovering the release layer from the base.

A supporting substrate of the present disclosure is, in an exemplary embodiment, a supporting substrate of a flexible OLED device, including: a release layer which is made of an alloy of aluminum and silicon; and a base supporting the release layer, the base being made of a material which is capable of transmitting ultraviolet light.

In one embodiment, the supporting substrate further includes a flexible film covering the release layer, the flexible film being made of the material which is capable of transmitting ultraviolet light.

In one embodiment, a weight percentage of silicon contained in the alloy is not less than 4% and not more than 20%.

In one embodiment, a linear expansion coefficient of the release layer is not less than 30% and not more than 500% of a linear expansion coefficient of the flexible film.

In one embodiment, a thickness of the release layer is not less than 100 nm and not more than 5000 nm.

Advantageous Effects of Invention

According to an embodiment of the present invention, a novel method for producing a flexible OLED device and a novel supporting substrate, which are capable of solving the above-described problems, are provided.

DESCRIPTION OF EMBODIMENTS

Figure 1A:
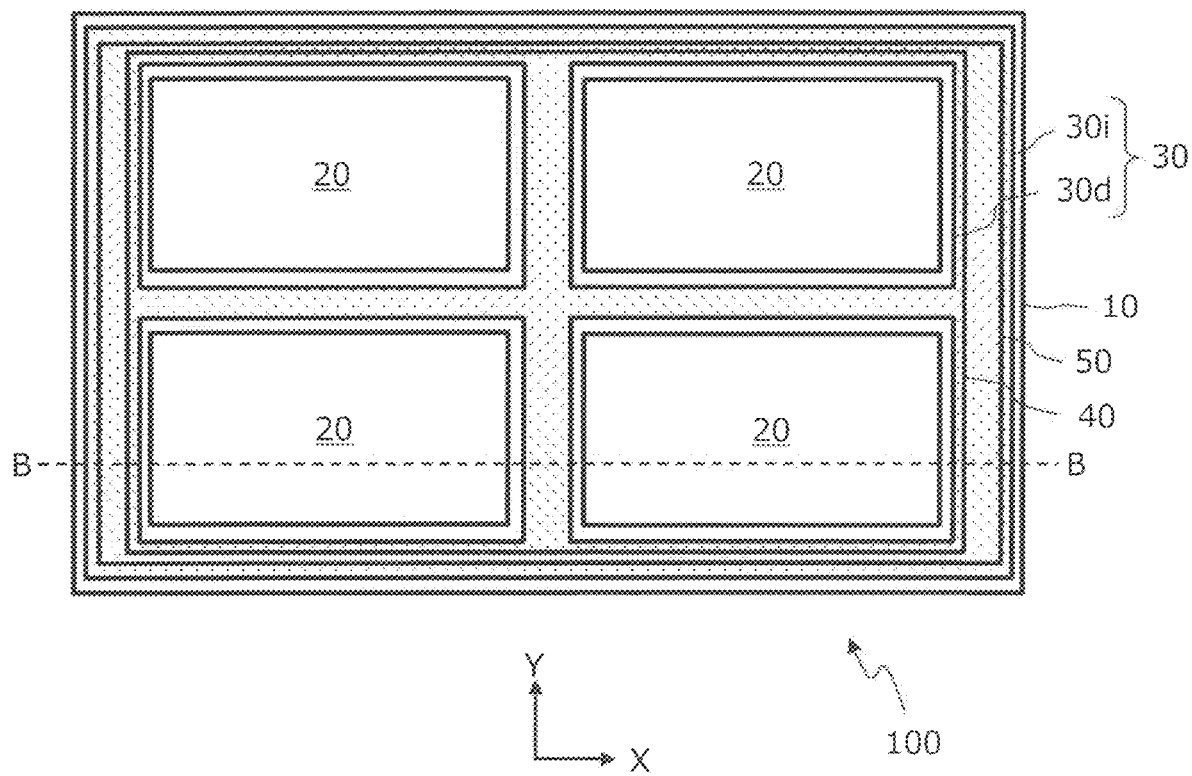
FIG. 1A is a plan view showing a configuration example of a multilayer stack used in a flexible OLED device production method of the present disclosure.

To perform Laser Lift Off (LLO) for delaminating a flexible substrate from a glass base, a release layer is provided between the glass base and the flexible substrate in some cases, but in other cases a release layer is not provided between the glass base and the flexible substrate.

When a release layer is not provided, the delamination yield decreases although the production cost decreases. More specifically, when laser light for delamination (lift-off light) is applied, residues in the form of soot which are called ashes and which are very difficult to remove are formed on both a surface of the glass base and a surface of the flexible substrate. This problem decreases the adhesion of a supporting film which is adhered to the flexible substrate after the laser lift-off process and also impedes the reuse of the glass base. Also, there is another problem that the irradiation condition range of laser light which can appropriately achieve delamination is narrow. In contrast, when a release layer is provided, formation of ashes is reduced, and the laser light irradiation condition range is relatively wide, so that the delamination yield improves. The release layer is typically made of amorphous silicon but can also be made of a refractory metal (Mo, Cr, W, Ti, etc.).

Conventionally, the flexible substrate is made of a resin material such as polyimide. Since such a resin material absorbs ultraviolet light, it has been believed that it is not necessary to consider the influence of lift-off light irradiation on TFT elements and OLED devices. However, the present inventor conducted research and found that, if the flexible substrate has a very small thickness of about 5 µm to 15 µm, the flexible substrate does not sufficiently absorb ultraviolet light in some cases, and there is a probability that ultraviolet laser light used in the delamination step will deteriorate TFT elements and OLED devices. This problem also occurred when the provided release layer is made of amorphous silicon. This is because amorphous silicon can transmit ultraviolet light. However, when the release layer is made of a refractory metal, the influence of lift-off light irradiation on TFT elements and OLED devices can be averted because the refractory metal absorbs ultraviolet light or reflects ultraviolet light so as not to transmit it. However, forming a release layer with the use of a refractory metal causes a significant increase in production cost.

The reason why amorphous silicon or refractory metal is used as the material of the release layer is its high melting point. That is, it has been believed that, to prevent the release layer from being melted by the heat resulting from the lift-off light irradiation, the release layer should be made of a refractory material.

However, the present inventor conducted research and found that, even when the release layer is made of an alloy of aluminum and silicon which has a low melting point, the release layer is not melted by the lift-off light irradiation. This is because aluminum, which is a major constituent, has large specific heat and latent heat of fusion and therefore has excellent heat conductivity. As a result, even if the release layer is locally heated by the lift-off light irradiation, the produced heat is quickly conducted to the surroundings so that breakage of the release layer can be avoided. As will be described later, the alloy of aluminum and silicon has a lower linear expansion coefficient than pure aluminum due to the presence of silicon. In general, the linear expansion coefficient of a metal is greater than the linear expansion coefficient of glass. Particularly, aluminum has a greater linear expansion coefficient than molybdenum which is a refractory metal. If the difference in thermal expansion coefficient between the release layer and the glass base is excessively large, part of the release layer can disadvantageously separate from the glass base due to internal stress or strain. The thermal expansion coefficient of the alloy of aluminum and silicon can be adjusted within a wide range according to the proportion of contained silicon. Further, by adjusting the deposition conditions of the aluminum alloy, the internal stress of a deposited film can be greatly reduced as compared with the internal stress of a refractory metal film (e.g., 400 GPa). Thus, by using the alloy of aluminum and silicon, the problem of separation of the release layer can be solved. Furthermore, the capability of using the alloy of aluminum and silicon, which is less expensive than refractory metals, as the release layer provides various advantages. For example, the refractory metal material is difficult to recycle, and it is necessary to dispose of it, in landfills, as industrial waste in the form of the glass base with the release layer adhered thereto. In contrast, the alloy of aluminum and silicon can be easily dissolved or removed using a chemical solution such as acid, so that the recyclability can improve. Thus, even when the release layer is used, the production cost can be reduced as a whole.

Hereinafter, an embodiment of a method and apparatus for producing a flexible OLED device of the present disclosure is described with reference to the drawings. In the following description, unnecessarily detailed description will be omitted. For example, detailed description of well-known matter and repetitive description of substantially identical elements will be omitted. This is for the purpose of avoiding the following description from being unnecessarily redundant and assisting those skilled in the art to easily understand the description. The present inventor provide the attached drawings and the following description for the purpose of assisting those skilled in the art to fully understand the present disclosure. Providing these drawings and description does not intend to limit the subject matter recited in the claims.

<Multilayer Stack>

Figure 1B:
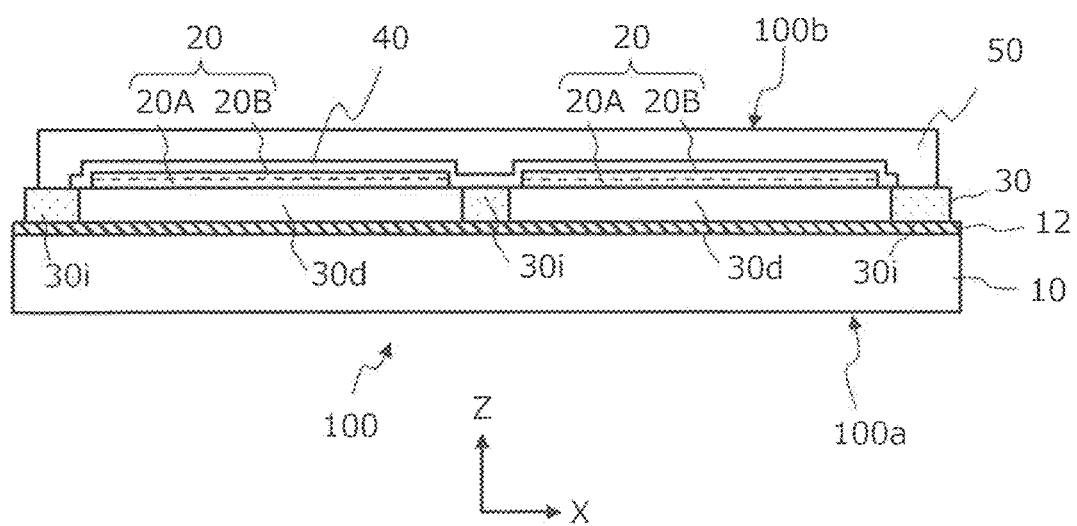
FIG. 1B is a cross-sectional view of the multilayer stack taken along line B-B of FIG. 1A.

See FIG. 1A and FIG. 1B. In a flexible OLED device production method of the present embodiment, firstly, a multilayer stack 100 illustrated in FIG. 1A and FIG. 1B is provided. FIG. 1A is a plan view of the multilayer stack 100. FIG. 1B is a cross-sectional view of the multilayer stack 100 taken along line B-B of FIG. 1A. In FIG. 1A and FIG. 1B, an XYZ coordinate system with X-axis, Y-axis and Z-axis, which are perpendicular to one another, is shown for reference.

The multilayer stack 100 of the present embodiment includes a base (motherboard or carrier) 10, functional layer regions 20 including a TFT layer 20A and an OLED layer 20B, a flexible film 30 provided between the base 10 and the functional layer regions 20 such that the flexible film 30 supports the functional layer regions 20, and a release layer 12 provided between the flexible film 30 and the base 10 and bound to the base 10. The release layer 12 is made of an alloy of aluminum and silicon. This multilayer stack 100 further includes a protection sheet 50 covering the plurality of functional layer regions 20 and a gas barrier film 40 provided between the plurality of functional layer regions 20 and the protection sheet 50 so as to cover the entirety of the functional layer regions 20. The multilayer stack 100 may include another unshown layer, such as a buffer layer.

A typical example of the base 10 is a glass base which has rigidity. A typical example of the flexible film is a synthetic resin film which has flexibility. Hereinafter, the "flexible film" is simply referred to as "plastic film". A structure which includes the release layer 12 and the base 10 supporting the release layer 12, as a whole, is referred to as a "supporting substrate" of a flexible OLED device. The supporting substrate may further include another film (e.g., flexible film) which covers the release layer 12.

In the present embodiment, the first surface 100a of the multilayer stack 100 is defined by the base 10. The second surface 100b of the multilayer stack 100 is defined by the protection sheet 50. The base 10 and the protection sheet 50 are materials temporarily used in the production process but are not constituents of a final flexible OLED device.

The plastic film 30 shown in the drawings includes a plurality of flexible substrate regions 30d respectively supporting the plurality of functional layer regions 20, and an intermediate region 30i surrounding each of the flexible substrate regions 30d. The flexible substrate regions 30d and the intermediate region 30i are merely different portions of a single continuous plastic film 30 and do not need to be physically distinguished. In other words, regions of the plastic film 30 lying immediately under respective ones of the functional layer regions 20 are the flexible substrate regions 30d, and the other region of the plastic film 30 is the intermediate region 30i.

Each of the plurality of functional layer regions 20 is a constituent of a final flexible OLED device. In other words, the multilayer stack 100 has such a structure that a plurality of flexible OLED devices which are not yet divided from one another are supported by a single base 10. Each of the functional layer regions 20 has such a shape that, for example, the thickness (size in Z-axis direction) is several tens of micrometers, the length (size in X-axis direction) is about 12 cm, and the width (size in Y-axis direction) is about 7 cm. These sizes can be set to arbitrary values according to the required largeness of the display screen. The shape in the XY plane of each of the functional layer regions 20 is rectangular in the example illustrated in the drawings but is not limited to this example. The shape in the XY plane of each of the functional layer regions 20 may include a square, a polygon, or a shape which includes a curve in the contour.

As shown in FIG. 1A, the flexible substrate regions 30d are two-dimensionally arrayed in rows and columns according to the arrangement of the flexible OLED devices. The intermediate region 30i consists of a plurality of stripes perpendicular to one another and forms a grid pattern. The width of the stripes is, for example, about 1-4 mm. The flexible substrate region 30d of the plastic film 30 functions as the "flexible substrate" in each flexible OLED device which is in the form of a final product. Meanwhile, the intermediate region 30i of the plastic film 30 is not a constituent of the final product.

In an embodiment of the present disclosure, the configuration of the multilayer stack 100 is not limited to the example illustrated in the drawings. The number of functional layer regions 20 (the number of OLED devices) supported by a single base 10 does not need to be plural but may be singular. When the number of functional layer regions 20 is singular, the intermediate region 30i of the plastic film 30 forms a simple frame pattern which surrounds a single functional layer region 20.

The size or proportion of each component illustrated in respective drawings is determined from the viewpoint of understandability. The actual size or proportion is not necessarily reflected in the drawings.

Supporting Substrate

Figure 2A:
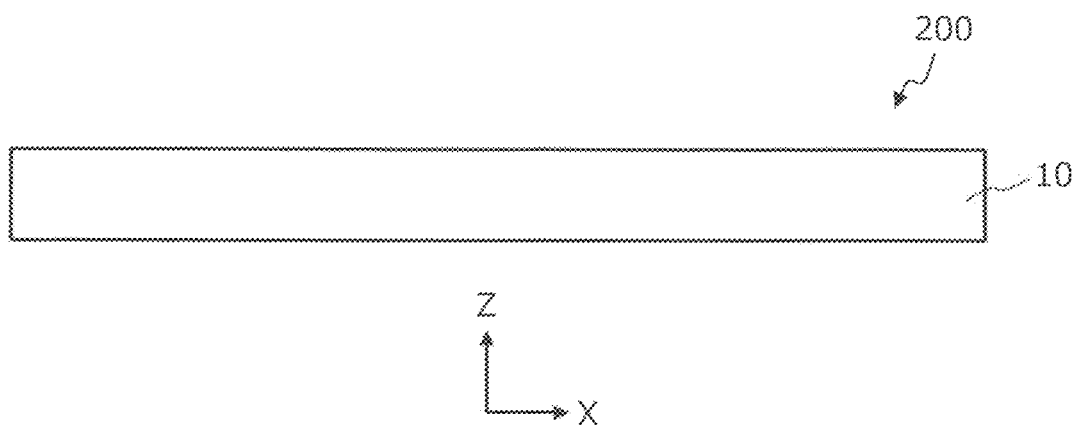
FIG. 2A is a cross-sectional view illustrating a step of a supporting substrate production method in an embodiment of the present disclosure.
Figure 2B:
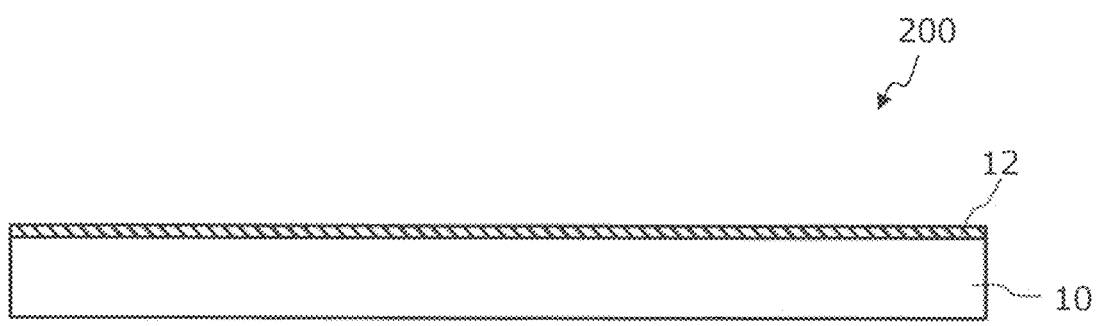
FIG. 2B is a cross-sectional view illustrating a step of the supporting substrate production method in an embodiment of the present disclosure.

A supporting substrate production method of an embodiment of the present disclosure is described with reference to FIG. 2A and FIG. 2B. FIG. 2A and FIG. 2B are cross-sectional views illustrating steps of a method for producing a supporting substrate 200 in an embodiment of the present disclosure.

Firstly, a base 10 is provided as shown in FIG. 2A. The base 10 is a carrier substrate for the process. The thickness of the base 10 is, for example, about 0.3-0.7 mm. The base 10 is typically made of glass. The base 10 is required to be capable of transmitting lift-off light which is to be applied at subsequent steps.

Next, as shown in FIG. 2B, a release layer 12 is formed on the base 10. The release layer 12 is made of an alloy of aluminum and silicon. The weight percentage of silicon contained in the alloy is not less than 4% and not more than 20%. With such a weight percentage of silicon contained, the linear expansion coefficient of the release layer 12 is lower than the linear expansion coefficient of pure aluminum (23.6 ppm/K). As previously described, by adjusting the proportion of silicon contained in the aluminum alloy and the deposition conditions, the linear expansion coefficient of the release layer 12 can be within the range of not less than 30% and not more than 500% of the linear expansion coefficient of the plastic film 30 while the absolute value of the internal stress of the release layer 12 is reduced to 10 MPa or lower. When the weight percentage of silicon contained in the alloy is not less than 10% and not more than 15%, the linear expansion coefficient is the smallest among alloys of aluminum and silicon, and the heat resistance and the abrasion resistance are excellent. Therefore, advantageously, reuse of the base 10 on which the release layer 12 is provided is easy. At the interface between the plastic film 30 and the release layer 12, thermal strain can occur due to the release layer 12 which absorbs ultraviolet light laser and produces heat. If the value of the linear expansion coefficient is largely different (e.g., the difference of 10 times or more) between the plastic film 30 and the release layer 12, large strain occurs in the plastic film 30 and can cause cracks in the lower barrier film interposed between the plastic film 30 and the functional layer region 20. From this viewpoint, it is not necessarily preferred that the linear expansion coefficient of the release layer 12 is close to the linear expansion coefficient of the base 10. It can be said that the alloy of aluminum and silicon has a linear expansion coefficient in an appropriate range for both the plastic film 30 and the base 10.

In the present embodiment, the linear expansion coefficients (room temperature) of the TFT layer 20A, the plastic film 30, the release layer 12 and the base 10 are, for example, 2-5 ppm/K, several tens of ppm/K, 19-23 ppm/K and 3-5 ppm/K, respectively. When a lower gas barrier film which will be described later is provided between the TFT layer 20A and the plastic film 30, the linear expansion coefficient of the lower gas barrier film is, for example, about 2-5 ppm/K. Note that the linear expansion coefficient of transparent polyimide which is the material of the plastic film 30 is about 25 ppm/K, and the linear expansion coefficient of polyethylene terephthalate (PET) is about 60 ppm/K. According to research by the present inventor, the linear expansion coefficient of the release layer is desirably between the linear expansion coefficient of the base 10 and the linear expansion coefficient of the plastic film 30 or is desirably not less than the linear expansion coefficient of the base 10 and not more than five times the linear expansion coefficient of the plastic film 30 (for example, 15-23 ppm/K; in a more specific example, 15-20 ppm/K).

The thickness of the release layer 12 can be not less than 100 nm and not more than 5000 nm. Although a typical example of the formation method of the release layer 12 is sputtering, the release layer 12 can be formed by plating. When plating is used, a release layer 12 can be realized which has a thickness in the order of μm. Since the major constituent of the alloy that forms the release layer 12 is aluminum, the heat conductivity of the alloy is sufficiently high and, even if the release layer 12 has a thickness of about several micrometers, delamination of the release layer 12 can be carried out.

When the release layer 12 is formed by sputtering, an aluminum target which contains silicon is sputtered, whereby an alloy is deposited on the base 10.

After the plastic film 30 is delaminated from the release layer 12 through a laser lift-off process which will be described later, the step of removing and recovering the release layer 12 from the base 10 may be performed.

The major constituent of the aluminum alloy used for the release layer 12 is aluminum which has a low melting point. This material has large specific heat and latent heat of fusion and has excellent heat conductivity, so that local heating is unlikely to occur. In other words, although the aluminum alloy is a material which has a low melting point as compared with refractory metals, melting of the release layer 12 does not occur when the release layer 12 is irradiated with the lift-off light. Even if, in production of heat by irradiation with the lift-off light, the spatial distribution of the intensity of the lift-off light is nonuniform, delamination failure is unlikely to occur because the heat is likely to transfer to the surroundings. More specifically, if there is dust adhered to the rear surface of the base 10 or there are scars formed in the rear surface of the base 10 and the lift-off light is introduced into the release layer 12 from the rear surface of the base 10, there is a probability that the intensity of the lift-off light on the release layer 12 will locally decrease due to the shadow of the dust or diffraction and reflection caused by the scars. When delamination of the plastic film 30 is performed by taking advantage of heat produced by a photoreaction, such local insufficiency of the lift-off light intensity leads to unsuccessful delamination at that position, and the problem of delamination failure arises. However, the release layer 12 of the present embodiment absorbs the lift-off light and produces and transmits heat and, therefore, the above-described problem resulting from local insufficiency of the lift-off light intensity can be avoided.

Hereinafter, the configuration and production method of the multilayer stack 100 are described in more detail.

Figure 3A:
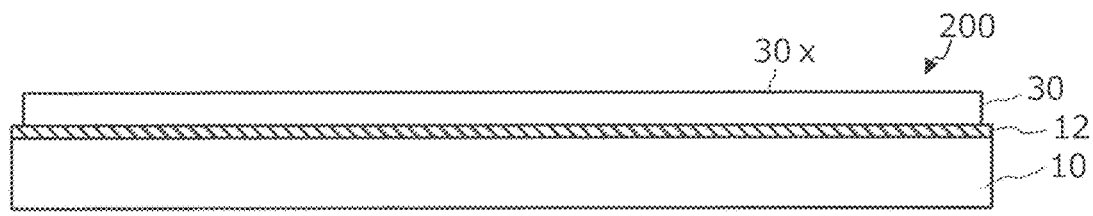
FIG. 3A is a cross-sectional view illustrating a step of a flexible OLED device production method in an embodiment of the present disclosure.

First, refer to FIG. 3A. FIG. 3A is a cross-sectional view showing a supporting substrate 200 which includes a plastic film 30 formed at its surface.

In the present embodiment, the plastic film 30 is a polyimide film having a thickness of, for example, not less than 5 μm and not more than 20 μm, for example a thickness of about 10 μm. The polyimide film can be formed from a polyamide acid, which is a precursor of polyimide, or a polyimide solution. The polyimide film may be formed by forming a polyamide acid film on the surface of the release layer 12 of the supporting substrate 200 and then thermally imidizing the polyamide acid film. Alternatively, the polyimide film may be formed by forming, on the surface of the release layer 12, a film from a polyimide solution which is prepared by melting a polyimide or dissolving a polyimide in an organic solvent. The polyimide solution can be obtained by dissolving a known polyimide in an arbitrary organic solvent. The polyimide solution is applied to the surface of the base 10 and then dried, whereby a polyimide film can be formed.

In the case of a bottom emission type flexible display, it is preferred that the polyimide film realizes high transmittance over the entire range of visible light. The transparency of the polyimide film can be represented by, for example, the total light transmittance in accordance with JIS K7105-1981. The total light transmittance can be set to not less than 80% or not less than 85%. On the other hand, in the case of a top emission type flexible display, it is not affected by the transmittance.

The plastic film 30 may be a film which is made of a synthetic resin other than polyimide. Note that, however, in the embodiment of the present disclosure, the process of forming a thin film transistor includes a heat treatment at, for example, not less than 350° C., and therefore, the plastic film 30 is made of a material which will not be deteriorated by this heat treatment.

The plastic film 30 may be a multilayer structure including a plurality of synthetic resin films. In one form of the present embodiment, in delaminating a flexible display structure from the base 10, LLO is carried out such that the plastic film 30 is irradiated with ultraviolet laser light (wavelength: 300-360 nm) transmitted through the base 10.

Since the release layer 12 that absorbs the laser light and produces heat is provided between the base 10 and the plastic film 30, part of the plastic film 30 (layered part) is gasified by the irradiation with the ultraviolet laser light at the interface between the release layer 12 and the plastic film 30, so that the plastic film 30 can readily be delaminated from the release layer 12, i.e., from the supporting substrate 200. Providing the release layer 12 also achieves the effect of suppressing generation of ashes.

Since in the embodiment of the present disclosure the release layer 12 has the properties of a metal whose major constituent is aluminum, the transmittance of the release layer 12 for ultraviolet laser light is extremely low. Thus, in the lift off step, the release layer 12 functions as an ultraviolet light shielding layer. As a result, entry of ultraviolet laser light from the base 10 into the functional layer regions 20, which would deteriorate the characteristics of the TFT layer 20A and the OLED layer 20B, is avoided or suppressed.

It has generally been believed that even if the transparency of the plastic film 30 is high, the plastic film 30 absorbs almost all of ultraviolet light. However, the plastic film 30 used in the flexible OLED device is an extremely thin layer and, therefore, if the release layer 12 that is made of a metal material is absent, ultraviolet laser light reaches the functional layer regions 20. Ultraviolet laser light can deteriorate not only the characteristics of the TFT layer 20A and the OLED layer 20B but also the encapsulation performance of the organic film and the inorganic film which are constituents of the encapsulation structure. Furthermore, since a plastic film 30 which is presently used in a wide variety of applications is made of a polyimide material which is yellowish brown or reddish brown in color, it is not recognized that transmission of ultraviolet laser light can deteriorate the characteristics of the functional layer regions. This is because such a polyimide material of low transparency strongly absorbs ultraviolet laser light. However, according to research by the present inventor, even if the plastic film 30 has low transparency, ultraviolet laser light can reach the functional layer regions 20 so long as the thickness of the plastic film 30 is, for example, only about 5-20 µm. Thus, the method of the embodiment of the present disclosure is suitably used not only for production of an OLED device which includes a plastic film (flexible substrate) which is made of a material which has high transparency and which is likely to transmit ultraviolet light but also for production of an OLED device which includes a plastic film 30 which has low transparency and which has a small thickness (thickness: about 5-20 µm).

Polyimide of high transparency and PET, which are capable of transmitting ultraviolet light, have low heat resistance as compared with polyimide of low transparency. However, the present inventor conducted research and found that a release layer 12 which is made of an alloy of aluminum and silicon has large specific heat and latent heat of fusion and therefore has excellent heat conductivity as previously described, and therefore, heat produced by ultraviolet light irradiation quickly transfers via the release layer 12, and even a plastic film of low heat resistance, such as polyimide of high transparency and PET, can be desirably delaminated without causing damage. In other words, the release layer 12 does not need to be made of a refractory metal. Even when the release layer 12 is made of a non-refractory metal material whose major constituent is aluminum, LLO is possible.

Forming the release layer 12 can cause an increase in production cost. However, recovery and recycling of the aluminum alloy are possible because the aluminum alloy can be easily dissolved using a chemical solution unlike refractory metals. Thus, even if the release layer is employed, the increase in production cost can be suppressed to a low level.

<Polishing>

When there is an object (target) which is to be polished away, such as particles or protuberances, on the surface 30x of the plastic film 30, the target may be polished away using a polisher such that the surface becomes flat. Detection of a foreign object, such as particles, can be realized by, for example, processing of an image obtained by an image sensor. After the polishing process, a planarization process may be performed on the surface 30x of the plastic film 30. The planarization process includes the step of forming a film which improves the flatness (planarization film) on the surface 30x of the plastic film 30. The planarization film does not need to be made of a resin.

<Lower Gas Barrier Film>

Then, a gas barrier film (not shown) may be formed on the plastic film 30. The gas barrier film can have various structures. Examples of the gas barrier film include a silicon oxide film and/or a silicon nitride film. Other examples of the gas barrier film can include a multilayer film including an organic material layer and an inorganic material layer. This gas barrier film may be referred to as "lower gas barrier film" so as to be distinguishable from a gas barrier film covering the functional layer regions 20, which will be described later. The gas barrier film covering the functional layer regions 20 can be referred to as "upper gas barrier film". The lower gas barrier film can be made of, for example, $Si_3N_4$. The linear expansion coefficient of $Si_3N_4$ is about 3 ppm/K. According to an embodiment of the present disclosure, the thermal expansion coefficient of the release layer 12 is between the linear expansion coefficient of the base 10 and the linear expansion coefficient of the plastic film 30. Thus, the problem of occurrence of a crack in the lower gas barrier layer that is made of $Si_3N_4$ can be avoided.

<Functional Layer Region>

Next, the process of forming the functional layer regions 20, including the TFT layer 20A and the OLED layer 20B, and the upper gas barrier film 40 is described.

Figure 3B:
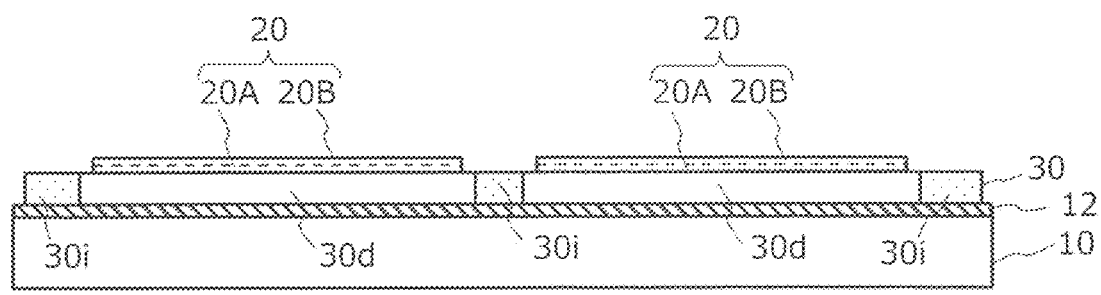
FIG. 3B is a cross-sectional view illustrating a step of the flexible OLED device production method in an embodiment of the present disclosure.

First, as shown in FIG. 3B, a plurality of functional layer regions 20 are formed on a base 10. There are a release layer 12 and a plastic film 30 between the base 10 and the functional layer regions 20. The release layer 12 and the plastic film 30 are bound to the base 10.

More specifically, the functional layer regions 20 include a TFT layer 20A (lower layer) and an OLED layer 20B (upper layer). The TFT layer 20A and the OLED layer 20B are sequentially formed by a known method. The TFT layer 20A includes a circuit of a TFT array which realizes an active matrix. The OLED layer 20B includes an array of OLED elements, each of which can be driven independently. The thickness of the TFT layer 20A is, for example, 4 µm. The thickness of the OLED layer 20B is, for example, 1 µm.

Figure 4:
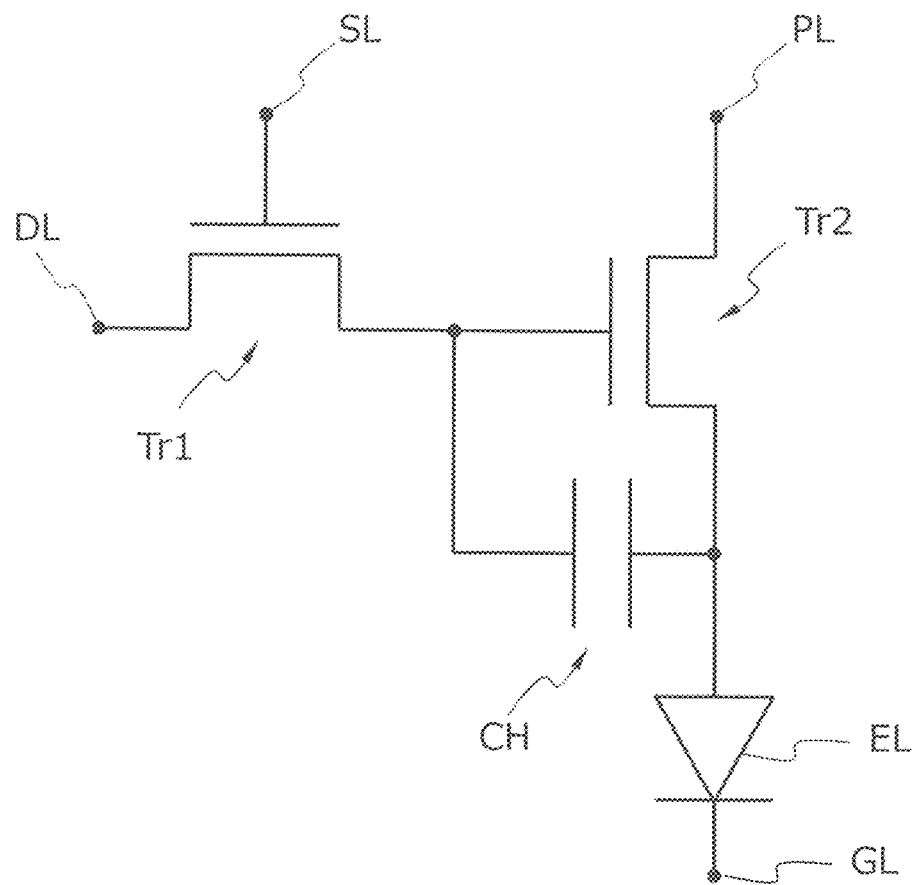
FIG. 4 is an equivalent circuit diagram of a single sub-pixel in a flexible OLED device.

FIG. 4 is a basic equivalent circuit diagram of a sub-pixel in an organic EL (Electro Luminescence) display. A single pixel of the display can consist of sub-pixels of different colors such as, for example, R (red), G (green), and B (blue). The example illustrated in FIG. 4 includes a selection TFT element Tr1, a driving TFT element Tr2, a storage capacitor CH, and an OLED element EL. The selection TFT element Tr1 is connected with a data line DL and a selection line SL. The data line DL is a line for transmitting data signals which define an image to be displayed. The data line DL is electrically coupled with the gate of the driving TFT element Tr2 via the selection TFT element Tr1. The selection line SL is a line for transmitting signals for controlling the ON/OFF state of the selection TFT element Tr1. The driving TFT element Tr2 controls the state of the electrical connection between a power line PL and the OLED element EL. When the driving TFT element Tr2 is ON, an electric current flows from the power line PL to a ground line GL via the OLED element EL. This electric current allows the OLED element EL to emit light. Even when the selection TFT element Tr1 is OFF, the storage capacitor CH maintains the ON state of the driving TFT element Tr2.

The TFT layer 20A includes a selection TFT element Tr1, a driving TFT element Tr2, a data line DL, and a selection line SL. The OLED layer 20B includes an OLED element EL. Before formation of the OLED layer 20B, the upper surface of the TFT layer 20A is planarized by an interlayer insulating film that covers the TFT array and various wires. A structure which supports the OLED layer 20B and which realizes active matrix driving of the OLED layer 20B is referred to as "backplane".

The circuit elements and part of the lines shown in FIG. 4 can be included in any of the TFT layer 20A and the OLED layer 20B. The lines shown in FIG. 4 are connected with an unshown driver circuit.

In the embodiment of the present disclosure, the TFT layer 20A and the OLED layer 20B can have various specific configurations. These configurations do not limit the present disclosure. The TFT element included in the TFT layer 20A may have a bottom gate type configuration or may have a top gate type configuration. Emission by the OLED element included in the OLED layer 20B may be of a bottom emission type or may be of a top emission type. The specific configuration of the OLED element is also arbitrary.

The material of a semiconductor layer which is a constituent of the TFT element includes, for example, crystalline silicon, amorphous silicon, and oxide semiconductor. In the embodiment of the present disclosure, part of the process of forming the TFT layer 20A includes a heat treatment step at 350° C. or higher for the purpose of improving the performance of the TFT element.

<Upper Gas Barrier Film>

Figure 3C:
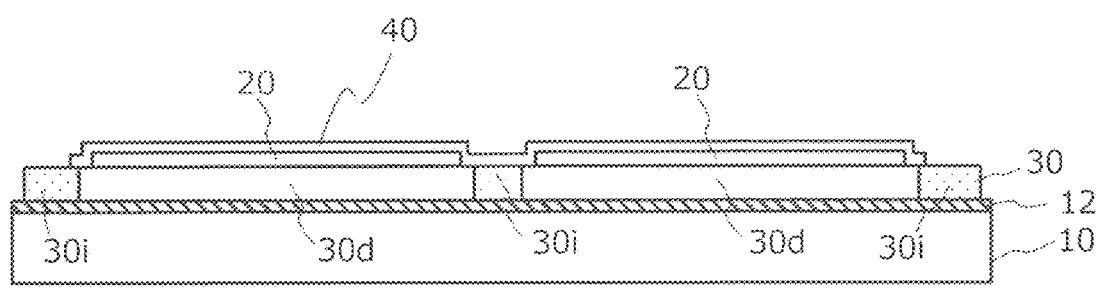
FIG. 3C is a cross-sectional view illustrating a step of the flexible OLED device production method in an embodiment of the present disclosure.

After formation of the above-described functional layer regions 20, the entirety of the functional layer regions 20 is covered with a gas barrier film (upper gas barrier film) 40 as shown in FIG. 3C. A typical example of the upper gas barrier film 40 is a multilayer film including an inorganic material layer and an organic material layer. Elements such as an adhesive film, another functional layer which is a constituent of a touchscreen, polarizers, etc., may be provided between the upper gas barrier film 40 and the functional layer regions 20 or in a layer overlying the upper gas barrier film 40. Formation of the upper gas barrier film 40 can be realized by a Thin Film Encapsulation (TFE) technique. From the viewpoint of encapsulation reliability, the WVTR (Water Vapor Transmission Rate) of a thin film encapsulation structure is typically required to be not more than $1 \times 10^{-4}$ g/m$^2$/day. According to the embodiment of the present disclosure, this criterion is met. The thickness of the upper gas barrier film 40 is, for example, not more than 1.5 µm.

Figure 5:
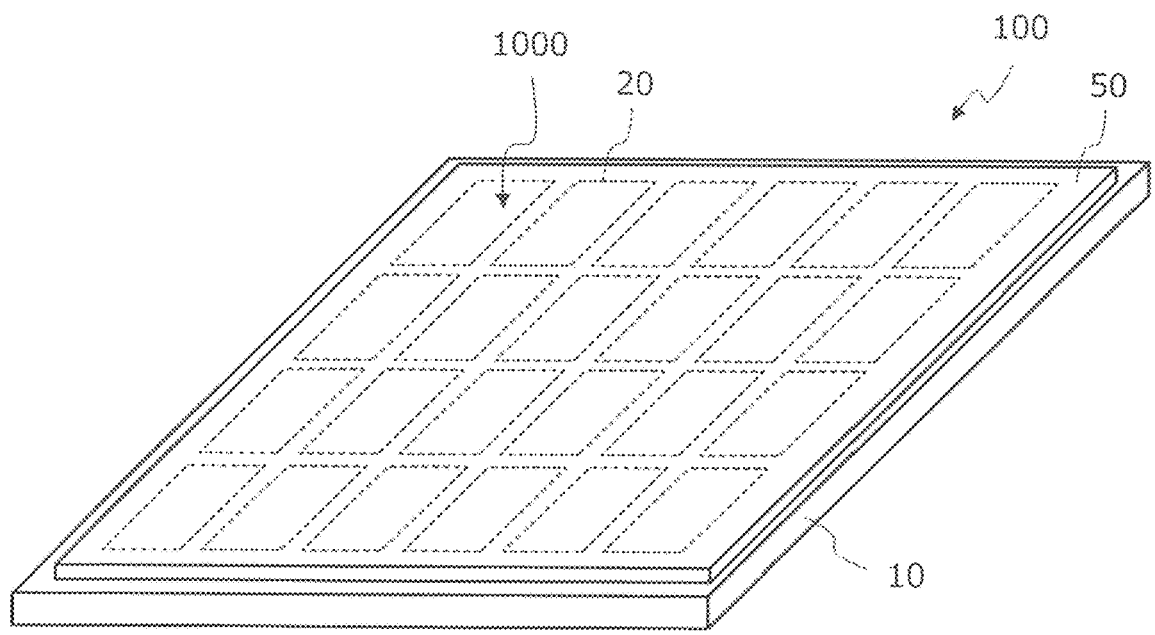
FIG. 5 is a perspective view of the multilayer stack in the middle of the production process.

FIG. 5 is a perspective view schematically showing the upper surface side of the multilayer stack 100 at a point in time when the upper gas barrier film 40 is formed. A single multilayer stack 100 includes a plurality of OLED devices 1000 supported by the base 10. In the example illustrated in FIG. 5, a single multilayer stack 100 includes a larger number of functional layer regions 20 than in the example illustrated in FIG. 1A. As previously described, the number of functional layer regions 20 supported by a single base 10 is arbitrary.

<Protection Sheet>

Figure 3D:
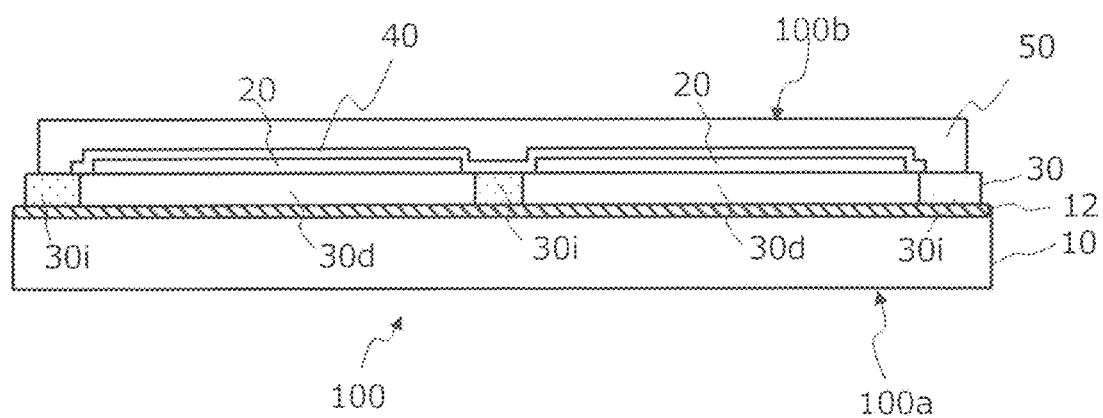
FIG. 3D is a cross-sectional view illustrating a step of the flexible OLED device production method in an embodiment of the present disclosure.

Next, refer to FIG. 3D. As shown in FIG. 3D, a protection sheet 50 is adhered to the upper surface of the multilayer stack 100. The protection sheet 50 can be made of a material such as, for example, polyethylene terephthalate (PET), polyvinyl chloride (PVC), or the like. As previously described, a typical example of the protection sheet 50 has a laminate structure which includes a layer of an applied mold-releasing agent at the surface. The thickness of the protection sheet 50 can be, for example, not less than 50 µm and not more than 150 µm.

After the thus-formed multilayer stack 100 is provided, the production method of the present disclosure can be carried out using the above-described production apparatus (delaminating apparatus 220).

The multilayer stack 100 which can be used in the production method of the present disclosure is not limited to the example illustrated in FIG. 1A and FIG. 1B. The protection sheet 50 may cover the entirety of the plastic film 30 and extend outward beyond the plastic film 30. Alternatively, the protection sheet 50 may cover the entirety of the plastic film 30 and extend outward beyond the base 10. As will be described later, after the base 10 is separated from the multilayer stack 100, the multilayer stack 100 is a thin flexible sheet-like structure which has no rigidity. The protection sheet 50 serves to protect the functional layer regions 20 from impact and abrasion when the functional layer regions 20 collide with or come into contact with external apparatuses or instruments in the step of delaminating the base 10 and the steps after the delaminating. Since the protection sheet 50 is peeled off from the multilayer stack 100 in the end, a typical example of the protection sheet 50 has a laminate structure which includes an adhesive layer of a relatively small adhesive force (a layer of an applied mold-releasing agent) over its surface. The more detailed description of the multilayer stack 100 will be described later.

<Dividing of OLED Devices>

In the flexible OLED device production method of the present embodiment, after the step of providing the multilayer stack 100, the step of dividing an intermediate region 30$i$ and respective ones of a plurality of flexible substrate regions 30$d$ of the plastic film 30 from one another is carried out. The step of dividing does not need to be carried out before the LLO step but may be carried out after the LLO step.

The dividing can be realized by cutting a central portion between adjoining OLED devices using a laser beam or dicing saw. In the present embodiment, the multilayer stack exclusive of the base 10 is cut, and the base 10 is not cut. However, the base 10 may be cut such that the multilayer stack is divided into partial multilayer structures each including an OLED device and a base portion that supports the OLED device.

Hereinafter, the step of cutting the multilayer structure exclusive of the base 10 by irradiation with a laser beam is described. The positions of irradiation with a laser beam for cutting are along the periphery of each of the flexible substrate regions 30$d$.

Figure 6A:
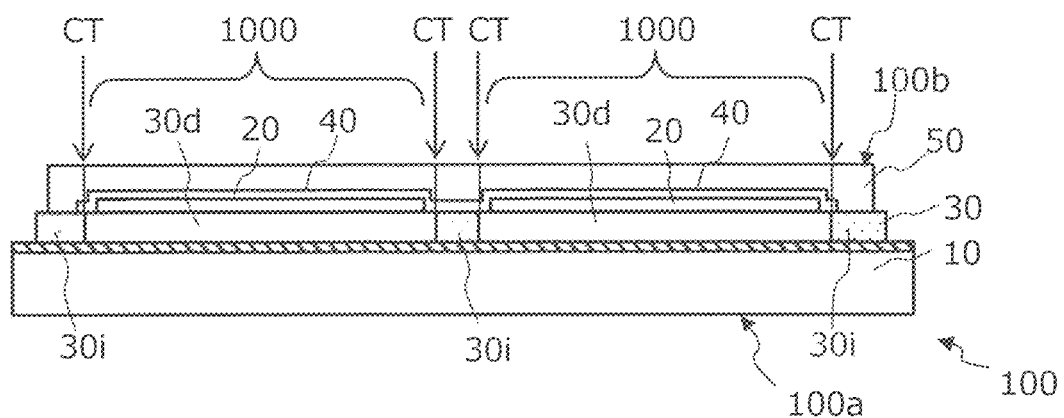
FIG. 6A is a cross-sectional view schematically showing the dividing positions in the multilayer stack.
Figure 6B:
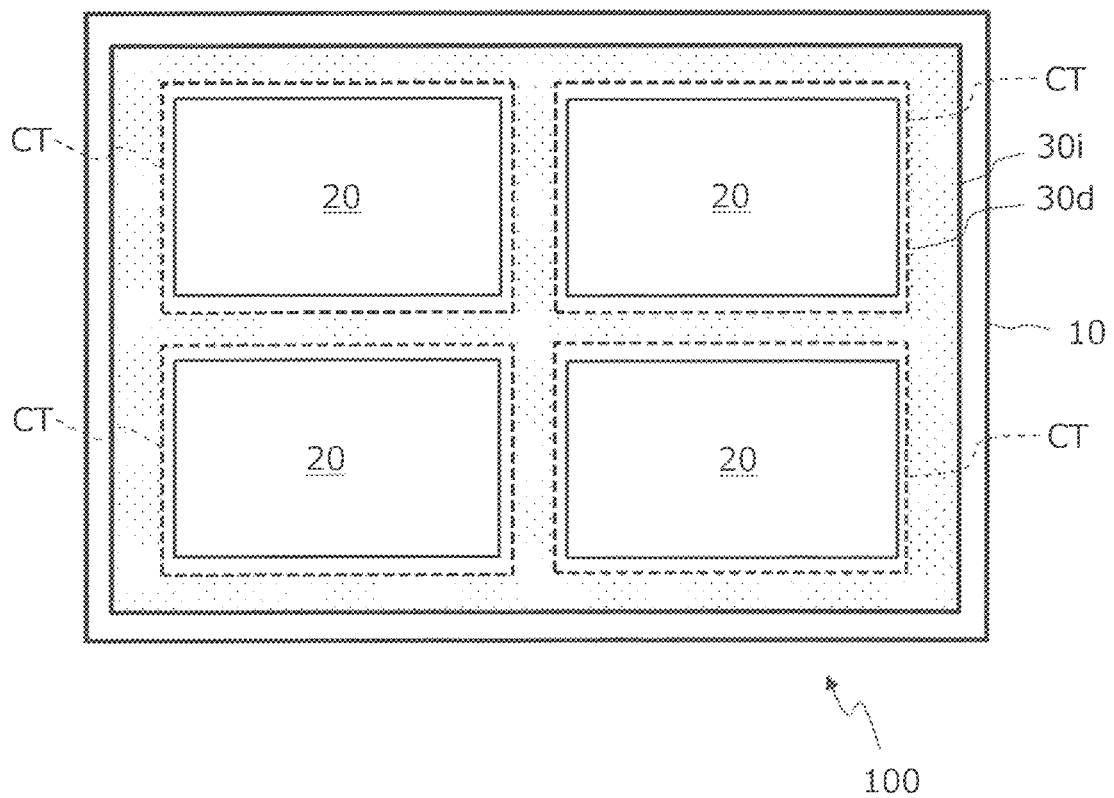
FIG. 6B is a plan view schematically showing the dividing positions in the multilayer stack.

FIG. 6A and FIG. 6B are a cross-sectional view and a plan view each schematically showing the positions at which the intermediate region 30$i$ of the plastic film 30 and respective ones of the plurality of flexible substrate regions 30$d$ are divided. The positions of irradiation with a laser beam for cutting are along the periphery of each of the flexible substrate regions 30d. In FIG. 6A and FIG. 6B, the irradiation positions (cut positions) CT represented by arrows or broken lines are irradiated with a laser beam for cutting, whereby the multilayer stack 100 exclusive of the base 10 is cut into the plurality of OLED devices 1000 and the remaining unnecessary portion. By the cutting, a gap of several tens of micrometers to several hundreds of micrometers is formed between each of the OLED devices 1000 and its surrounding. Such a cutting can also be realized by a dicing saw instead of laser beam irradiation as previously described. After the cutting, the OLED devices 1000 and the remaining unnecessary portion are still kept bound to the base 10.

As shown in FIG. 6B, the planar layout of the "unnecessary portion" in the multilayer stack 100 accords with the planar layout of the intermediate region 30i of the plastic film 30. In the illustrated example, the "unnecessary portion" is a single continuous sheet-like structure which has openings. However, the embodiments of the present disclosure are not limited to this example. The irradiation positions CT with the laser beam for cutting may be set such that the "unnecessary portion" is separated into a plurality of portions. Note that the sheet-like structure, which is the "unnecessary portion", includes not only the intermediate region 30i of the plastic film 30 but also cut portions of layered components on the intermediate region 30i (e.g., the gas barrier film 40 and the protection sheet 50).

When the cutting is realized by a laser beam, the wavelength of the laser beam may be in any of the infrared, visible and ultraviolet bands. From the viewpoint of reducing the effect of the cutting on the base 10, the laser beam desirably has a wavelength in the range of green to ultraviolet. For example, when a Nd:YAG laser device is used, the cutting can be carried out using a second harmonic wave (wavelength: 532 nm) or a third harmonic wave (wavelength: 343 nm or 355 nm). In such a case, the laser power is adjusted to 1 to 3 watts, and the scanning rate is set to about 500 mm per second, so that the multilayer structure supported by the base 10 can be cut (divided) into OLED devices and unnecessary portions without damaging the base 10.

According to the embodiment of the present disclosure, the timing of the above-described cutting is earlier than in the prior art. Since the cutting is carried out while the plastic film 30 is bound to the base 10, alignment for the cutting can be made with high precision and accuracy even if the gap between adjoining OLED devices 1000 is narrow. Thus, the gap between adjoining OLED devices 1000 can be shortened, and accordingly, useless portions which are unnecessary for a final product can be reduced.

<Lift-Off Light Irradiation>

Figure 7A:
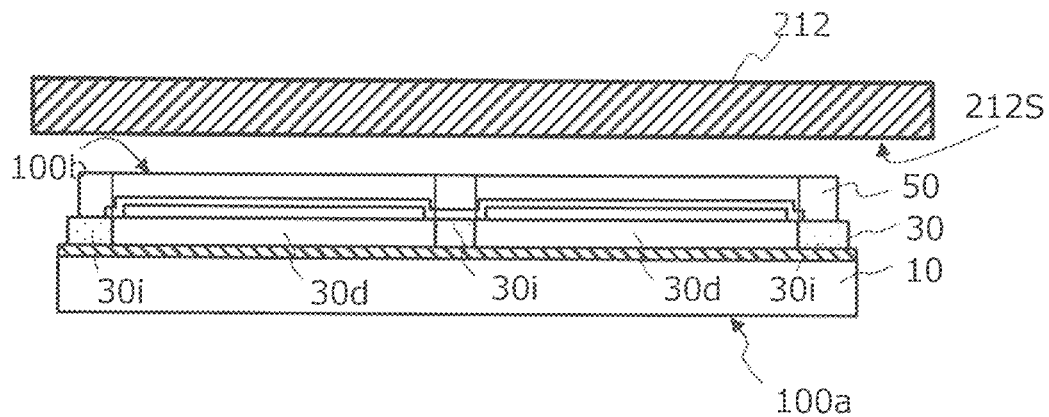
FIG. 7A is a diagram schematically showing a state immediately before a stage supports a multilayer stack.

FIG. 7A schematically shows a state in an unshown production apparatus (delaminating apparatus) immediately before the stage 212 supports the multilayer stack 100. In the present embodiment, the stage 212 is a chuck stage which has a large number of pores in the surface for suction. The configuration of the chuck stage is not limited to this example. It may include an electrostatic chuck for supporting the multilayer stack or any other fixing device. The multilayer stack 100 is arranged such that the second surface 100b of the multilayer stack 100 faces the surface 212S of the stage 212, and is in close contact with the stage 212.

Figure 7B:
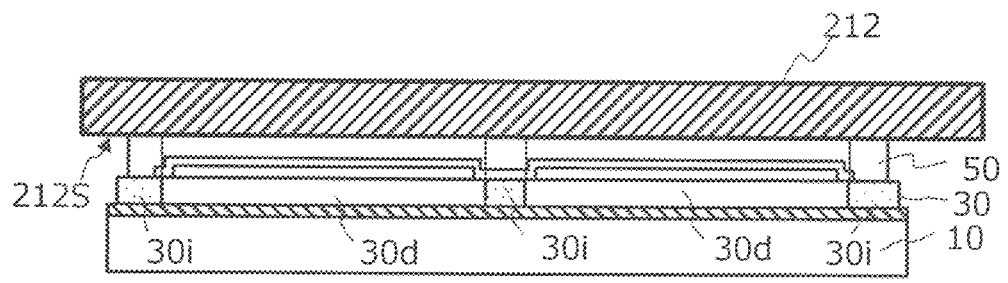
FIG. 7B is a diagram schematically showing a state where the stage supports the multilayer stack.

FIG. 7B schematically shows a state where the stage 212 supports the multilayer stack 100. The arrangement of the stage 212 and the multilayer stack 100 is not limited to the example illustrated in the drawing. For example, the multilayer stack 100 may be placed upside down such that the stage 212 is present under the multilayer stack 100.

In the example illustrated in FIG. 7B, the multilayer stack 100 is in contact with the surface 212S of the stage 212, and the stage 212 holds the multilayer stack 100 by suction.

Figure 7C:
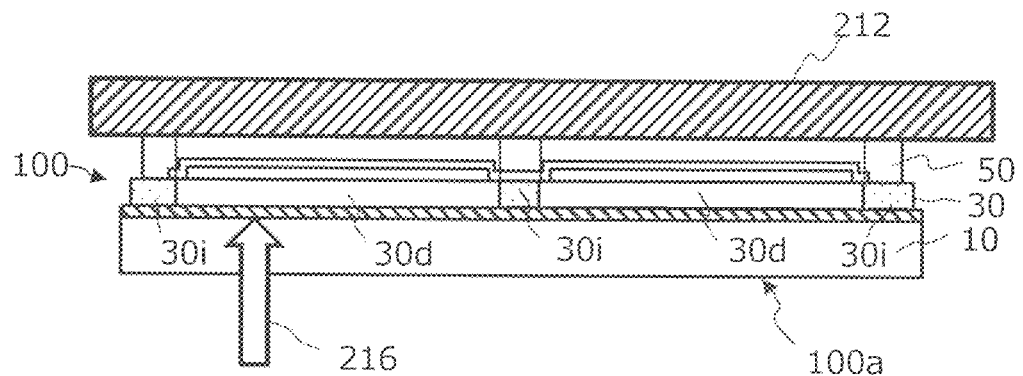
FIG. 7C is a diagram schematically showing that the interface between a base and a plastic film of the multilayer stack with laser light (lift-off light) in the shape of a line.

Then, as shown in FIG. 7C, the release layer 12 that is present between the plurality of flexible substrate regions 30d of the plastic film 30 and the base 10 is irradiated with laser light (lift-off light) 216. FIG. 7C schematically illustrates irradiation of the release layer 12 at the base 10 side with the lift-off light 216 in the shape of a line extending in a direction vertical to the sheet of the drawing. The release layer 12 absorbs ultraviolet laser light to be heated within a short time period. A part of the plastic film 30 at the interface between the release layer 12 and the plastic film 30 gasifies or decomposes (disappears) due to the heat from the release layer 12. By scanning the release layer 12 with the lift-off light 216, the degree of binding of the plastic film 30 to the release layer 12, in other words, the supporting substrate 200, is reduced. The wavelength of the lift-off light 216 is typically in the ultraviolet band. The light absorption by the base 10 is, for example, about 10% in the wavelength range of 343-355 nm but can increase to 30-60% at 308 nm.

Hereinafter, lift-off light irradiation according to the present embodiment is described in detail.

In the present embodiment, the delaminating apparatus includes a line beam source for emitting the lift-off light 216. The line beam source includes a laser device and an optical system for shaping laser light emitted from the laser device into a line beam.

Figure 8A:
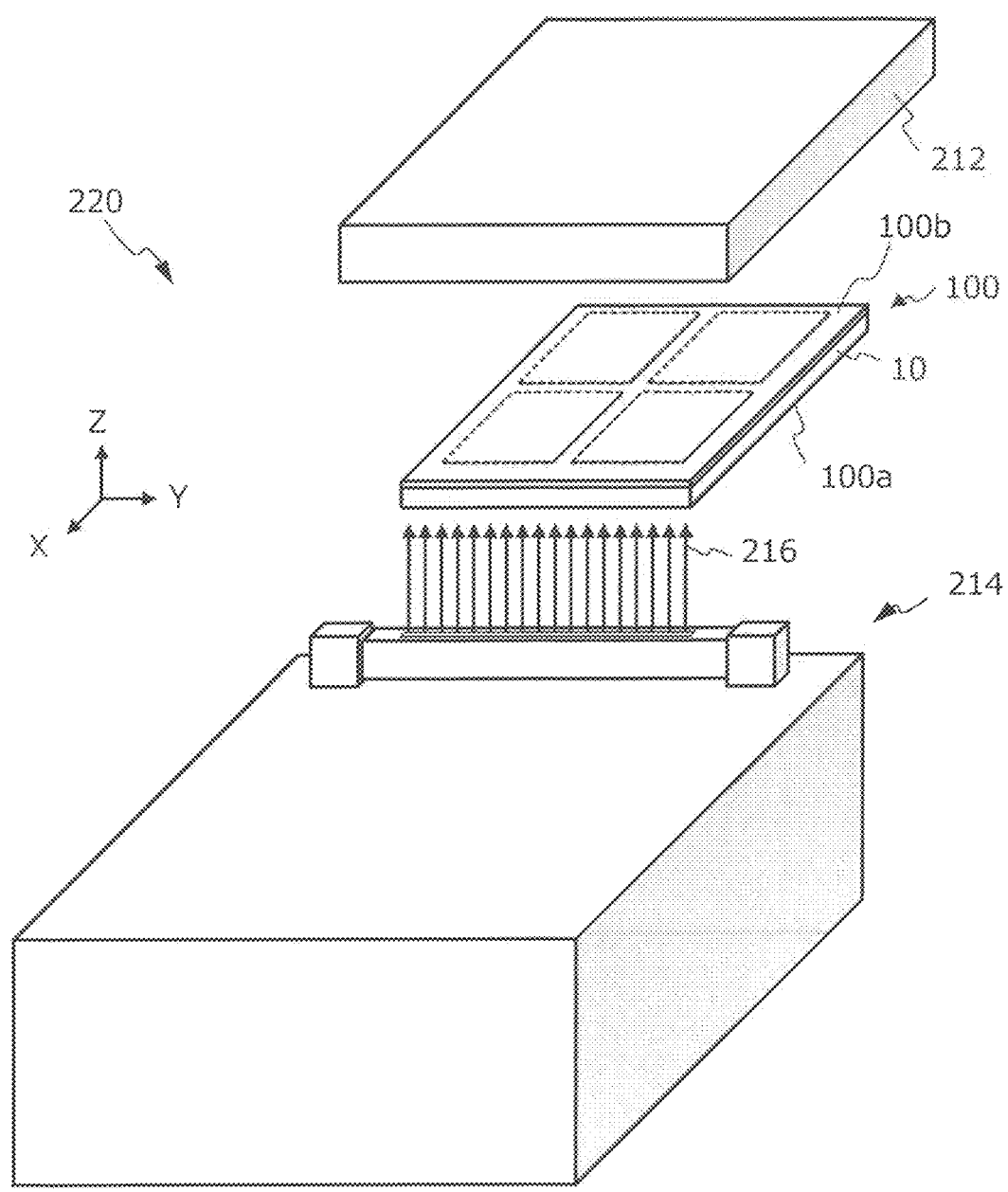
FIG. 8A is a perspective view schematically showing irradiation of the multilayer stack with a line beam emitted from a line beam source of a delaminating apparatus.

FIG. 8A is a perspective view schematically showing irradiation of the multilayer stack 100 with a line beam (lift-off light 216) emitted from a line beam source 214 of a delaminating apparatus 220. For the sake of understandability, the stage 212, the multilayer stack 100 and the line beam source 214 are shown as being spaced away from one another in the Z-axis direction of the drawing. During irradiation with the lift-off light 216, the second surface 100b of the multilayer stack 100 is in contact with the stage 212.

Figure 8B:
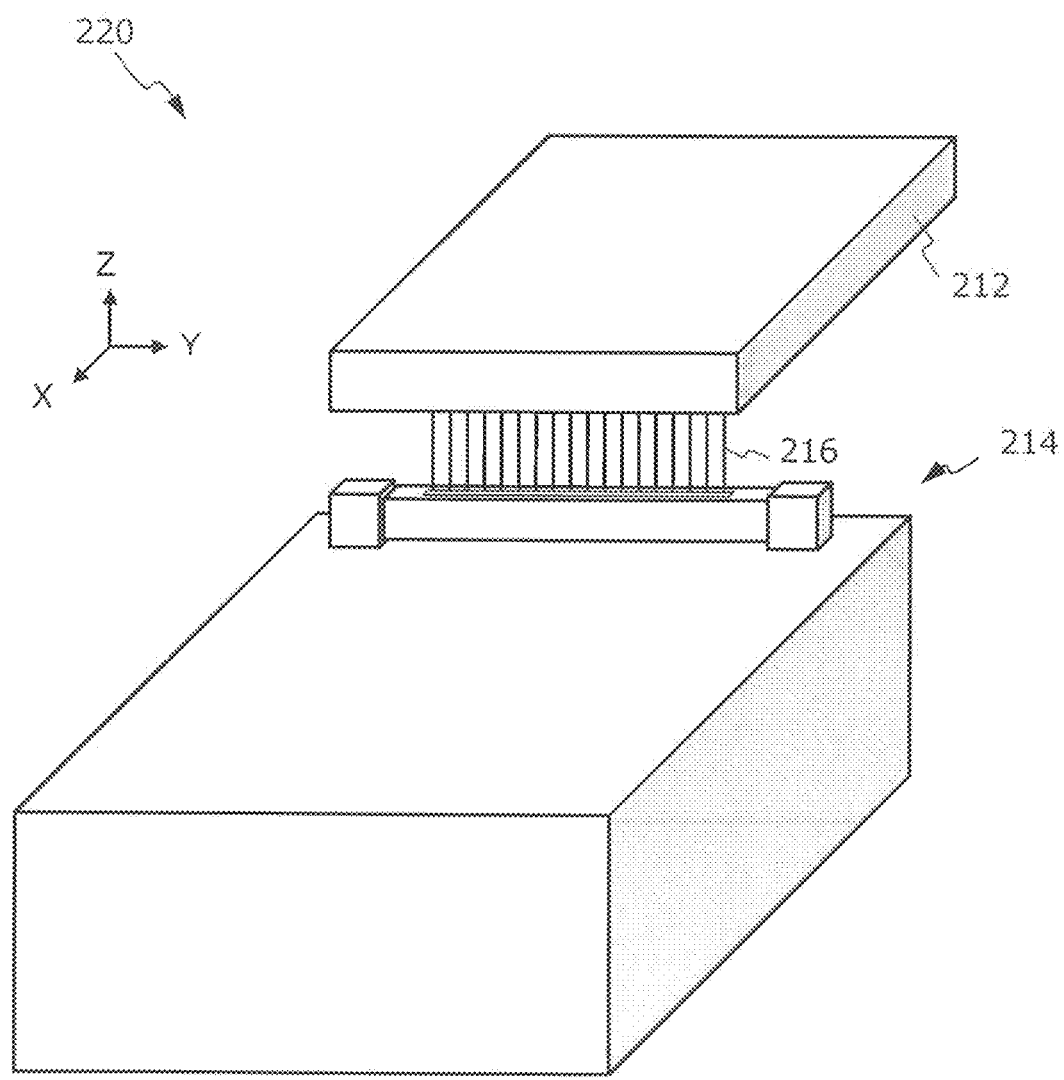
FIG. 8B is a diagram schematically showing the position of the stage at the start of irradiation with lift-off light.

FIG. 8B schematically shows the position of the stage 212 during irradiation with the lift-off light 216. Although not shown in FIG. 8B, the multilayer stack 100 is supported by the stage 212.

Examples of the laser device that emits the lift-off light 216 include gas laser devices such as excimer laser, solid laser devices such as YAG laser, semiconductor laser devices, and other types of laser devices. A XeCl excimer laser device can generate laser light at the wavelength of 308 nm. When yttrium orthovanadate ($YVO_4$) doped with neodymium (Nd) or $YVO_4$ doped with ytterbium (Yb) is used as a lasing medium, the wavelength of laser light (fundamental wave) emitted from the lasing medium is about 1000 nm. Therefore, the fundamental wave can be converted by a wavelength converter to laser light at the wavelength of 340-360 nm (third harmonic wave) before it is used.

From the viewpoint of suppressing generation of ashes, using laser light at the wavelength of 308 nm from the excimer laser device, rather than laser light at the wavelength of 340-360 nm, is more effective. Further, the presence of the release layer 12 brings about a profound effect in suppressing generation of ashes.

The irradiation with the lift-off light 216 can be carried out with the power density (irradiance) of, for example, 50-400 $mJ/cm^2$. By using a release layer formed of an alloy of aluminum and silicon which has good thermal conductivity, the lower limit of the power density can be greatly extended. The lift-off light 216 in the shape of a line beam has a size which can extend across the base 10, i.e., a line length which exceeds the length of one side of the base (long axis dimension, size in Y-axis direction of FIG. 8B). The line length can be, for example, not less than 750 mm. Meanwhile, the line width of the lift-off light 216 (short axis dimension, size in X-axis direction of FIG. 8B) can be, for example, about 0.2 mm. These dimensions represent the size of the irradiation region at the interface between the plastic film 30 and the base 10. The lift-off light 216 can be emitted in the form of a pulsed or continuous wave. Irradiation with the pulsed wave can be carried out at the frequency of, for example, about 200 times per seconds.

Figure 8C:
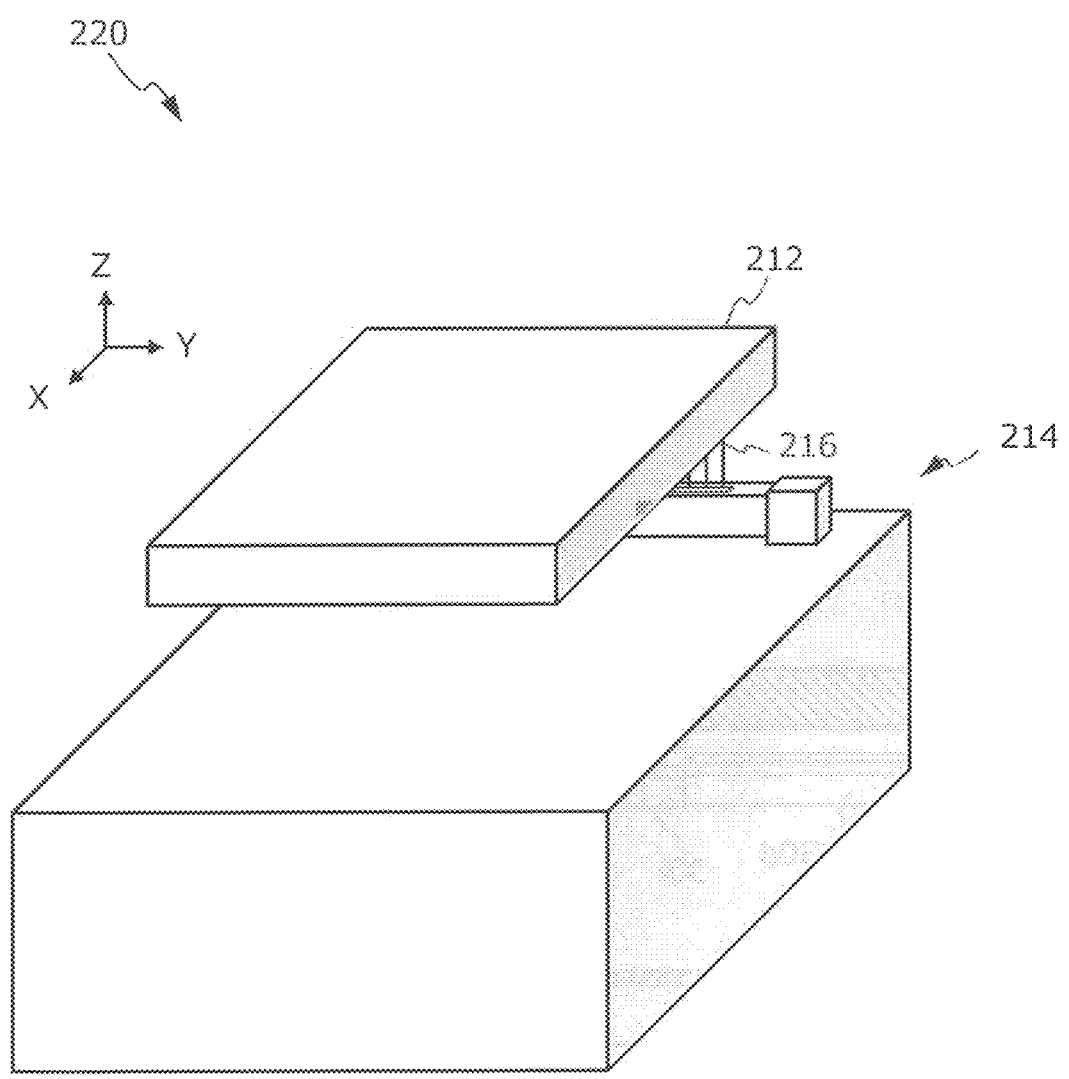
FIG. 8C is a diagram schematically showing the position of the stage at the end of irradiation with lift-off light.

The position of irradiation with the lift-off light 216 moves relative to the base 10 for scanning with the lift-off light 216. In the delaminating apparatus 220, the multilayer stack 100 may be movable while the light source 214 from which the lift-off light is to be emitted and an optical unit (not shown) are stationary, and vice versa. In the present embodiment, irradiation with the lift-off light 216 is carried out during a period where the stage 212 moves from the position shown in FIG. 8B to the position shown in FIG. 8C. That is, scanning with the lift-off light 216 is carried out by movement of the stage 212 in the X-axis direction.

<Lift-Off>

Figure 9A:
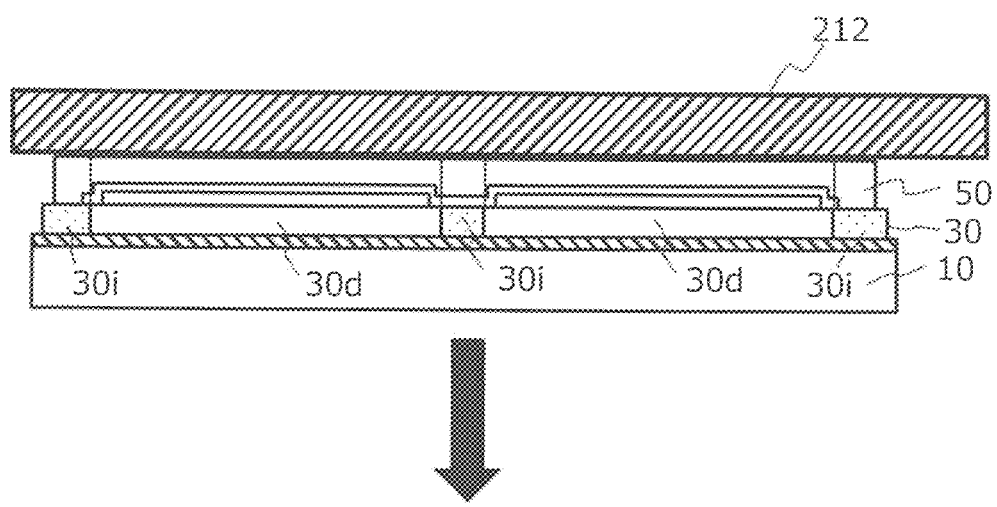
FIG. 9A is a cross-sectional view schematically showing the multilayer stack before the multilayer stack is separated into the first portion and the second portion after irradiation with lift-off light.

FIG. 9A illustrates a state where the multilayer stack 100 is in contact with the stage 212 after irradiation with the lift-off light. While this state is maintained, the distance from the stage 212 to the base 10 is increased. At this point in time, the stage 212 of the present embodiment holds an OLED device portion of the multilayer stack 100 by suction.

An unshown actuator holds the base 10 and moves the entirety of the base 10 in the direction of the arrow, thereby carrying out delaminating (lift-off). The base 10 can be moved together with an unshown chuck stage while being adhered by suction to the chuck stage. The direction of movement of the base 10 does not need to be vertical, but may be diagonal, to the first surface 100a of the multilayer stack 100. The movement of the base 10 does not need to be linear but may be rotational. Alternatively, the stage 212 may be moved upward in the drawing while the base 10 is secured by an unshown holder or another stage.

Figure 9B:
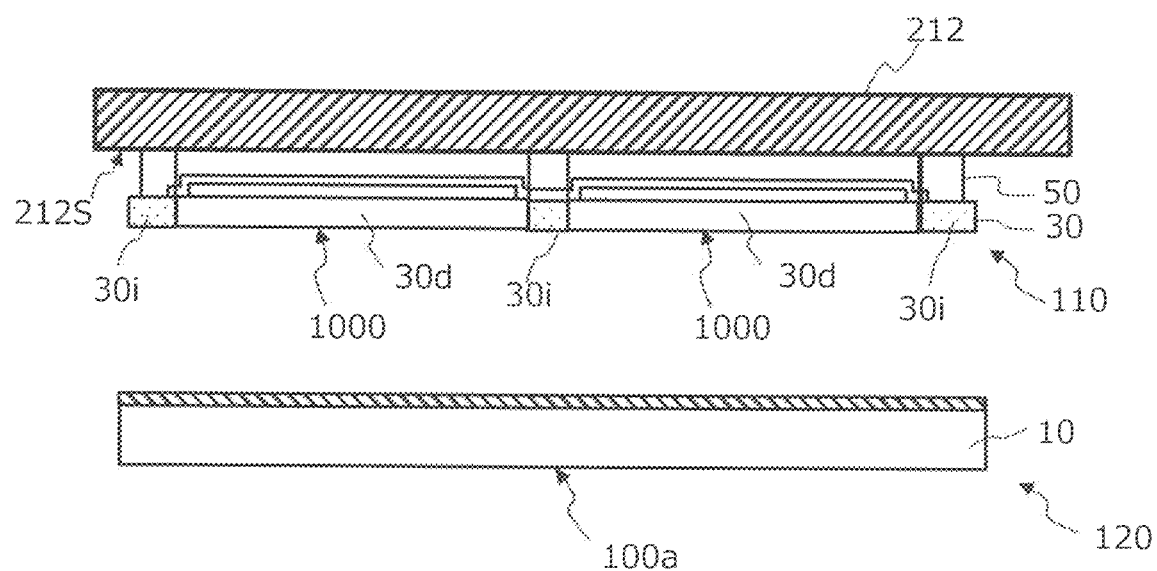
FIG. 9B is a cross-sectional view schematically showing the multilayer stack separated into the first portion and the second portion.

FIG. 9B is a cross-sectional view showing the thus-separated first portion 110 and second portion 120 of the multilayer stack 100. The first portion 110 of the multilayer stack 100 includes a plurality of OLED devices 1000 which are in contact with the stage 212. The respective OLED devices 1000 include the functional layer regions 20 and the plurality of flexible substrate regions 30d of the plastic film 30. Meanwhile, the second portion 120 of the multilayer stack 100 includes the base 10 and the release layer 12.

Respective ones of the OLED devices 1000 supported by the stage 212 are cut off from one another and therefore can be simultaneously or sequentially separated from the stage 212 in an easy manner.

Although in the above-described embodiment respective ones of the OLED devices 1000 are cut away before the LLO step, respective ones of the OLED devices 1000 may be cut away after the LLO step. Cutting away respective ones of the OLED devices 1000 may include dividing the base 10 into corresponding portions.

According to an embodiment of the present disclosure, even when the flexible film used is made of a polyimide of high transparency which is capable of transmitting ultraviolet light and PET, or when the flexible film used has low transparency but is thin (thickness: 5-20 μm) so that it is capable of transmitting ultraviolet light, deterioration by ultraviolet light in characteristics of the functional layer region and deterioration by ultraviolet light in performance of the gas barrier layer can be suppressed. Since recovery and recycling of aluminum alloys are easy unlike refractory metals, the increase of the production cost which is caused by employing the release layer can be suppressed to a low level.

INDUSTRIAL APPLICABILITY

An embodiment of the present invention provides a novel flexible OLED device production method. A flexible OLED device is broadly applicable to smartphones, tablet computers, on-board displays, and small-, medium- and large-sized television sets.

REFERENCE SIGNS LIST

10 . . . base, 12 . . . release layer, 20 . . . functional layer region, 20A . . . TFT layer, 20B . . . OLED layer, 30 . . . plastic film, 30d . . . flexible substrate region of plastic film, 30i . . . intermediate region of plastic film, 40 . . . gas barrier film, 50 . . . protection sheet, 100 . . . multilayer stack, 212 . . . stage, 1000 . . . OLED device

The invention claimed is:

1. A method for producing a flexible OLED device, comprising:
  providing a multilayer stack, the multilayer stack including a base, a functional layer region which includes a TFT layer and an OLED layer, a flexible film provided between the base and the functional layer region and supporting the functional layer region, and a release layer provided between the flexible film and the base and bound to the base; and
  scanning the release layer with ultraviolet laser light transmitted through the base to produce heat for delaminating the flexible film from the release layer, thereby moving a heated area along the release layer and delaminating the flexible film from the release layer,
  wherein the release layer is made of an alloy of aluminum and silicon, and
  a linear expansion coefficient of the release layer is not less than 30% and not more than 500% of a linear expansion coefficient of the flexible film.

2. The method of claim 1, wherein a thickness of the release layer is not less than 100 nm and not more than 5000 nm.

3. The method of claim 1, wherein a thickness of the flexible film is not less than 5 μm and not more than 20 μm.

4. A method for producing a flexible OLED device, comprising:
  providing a multilayer stack, the multilayer stack including a base, a functional layer region which includes a TFT layer and an OLED layer, a flexible film provided between the base and the functional layer region and supporting the functional layer region, and a release layer provided between the flexible film and the base and bound to the base; and
  irradiating the release layer with ultraviolet laser light transmitted through the base, thereby delaminating the flexible film from the release layer,
  wherein the release layer is made of an alloy of aluminum and silicon, and
  a weight percentage of silicon contained in the alloy is not less than 4% and not more than 20%.

5. The method of claim 4, wherein a wavelength of the ultraviolet laser light is not less than 300 nm and not more than 360 nm.

6. The method of claim 4, wherein providing the multilayer stack includes
sputtering an aluminum target which contains silicon, thereby forming the release layer on the base, and
forming the flexible film on the release layer.

7. A method for producing a flexible OLED device, comprising:
providing a multilayer stack, the multilayer stack including a base, a functional layer region which includes a TFT layer and an OLED layer, a flexible film provided between the base and the functional layer region and supporting the functional layer region, and a release layer provided between the flexible film and the base and bound to the base; and
irradiating the release layer with ultraviolet laser light transmitted through the base, thereby delaminating the flexible film from the release layer,
wherein the release layer is made of an alloy of aluminum and silicon, and
the method further comprises, after the flexible film is delaminated from the release layer, removing and recovering the release layer from the base.

8. A supporting substrate of a flexible OLED device, comprising:
a release layer which is made of an alloy of aluminum and silicon;
a base supporting the release layer, the base being made of a material which is capable of transmitting ultraviolet light; and
a flexible film covering the release layer, the flexible film being made of another material which is capable of transmitting ultraviolet light,
wherein a linear expansion coefficient of the release layer is not less than 30% and not more than 500% of a linear expansion coefficient of the flexible film.

9. The supporting substrate of claim 8, wherein a weight percentage of silicon contained in the alloy is not less than 4% and not more than 20%.

10. The supporting substrate of claim 8, wherein a thickness of the release layer is not less than 100 nm and not more than 5000 nm.

* * * * *